United States Patent
Ferencz

(10) Patent No.: US 6,677,847 B1
(45) Date of Patent: Jan. 13, 2004

(54) IN BOARD FILTER INDUCTOR FOR SWITCHING POWER SUPPLY ON A PRINTED CIRCUIT BOARD

(75) Inventor: Andrew Ferencz, Southborough, MA (US)

(73) Assignee: Galaxy Power, Inc., Westborough, MA (US)

( * ) Notice: Subject to any disclaimer, the term of this patent is extended or adjusted under 35 U.S.C. 154(b) by 0 days.

(21) Appl. No.: 10/219,805

(22) Filed: Aug. 15, 2002

(51) Int. Cl.[7] .................................................. H01F 5/00
(52) U.S. Cl. ...................... 336/200; 336/232; 336/223; 29/602.1; 29/605
(58) Field of Search ................................. 336/200, 232, 336/223, 83, 183; 29/605, 602.1

(56) References Cited

U.S. PATENT DOCUMENTS 6,281,779 B1 * 8/2001 Matsumoto et al. ........ 336/200
6,307,458 B1 * 10/2001 Zhang et al. ................ 336/200

* cited by examiner

Primary Examiner—Lincoln Donovan
Assistant Examiner—Jennifer A. Poker
(74) Attorney, Agent, or Firm—Cesari and McKenna, LLP

(57) ABSTRACT

An inductor is formed by two traces on a multilayer PC board passing through a ferromagnetic "E" shaped core. The first trace is the positive output bus of the DC power supply, and the second trace is the negative output bus of the DC power supply. Sense lines used to sense voltage levels in the load are put through the same opening in the ferromagnetic "E" core as an output bus trace. The sense lines are traces in a level of the multilevel PC board.

26 Claims, 6 Drawing Sheets

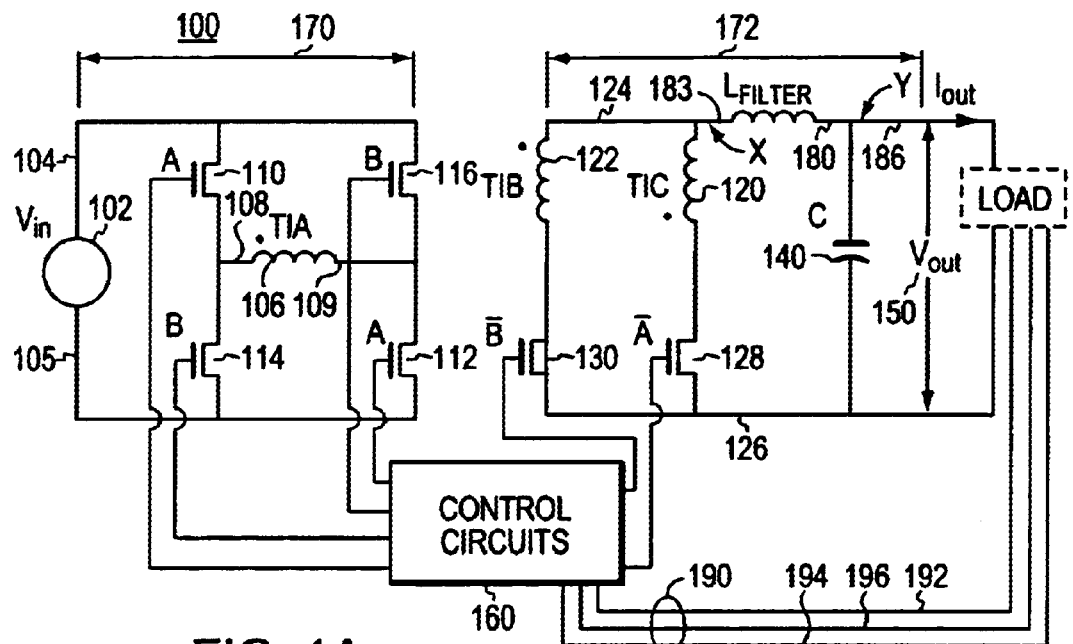
FIG. 1A
PRIOR ART
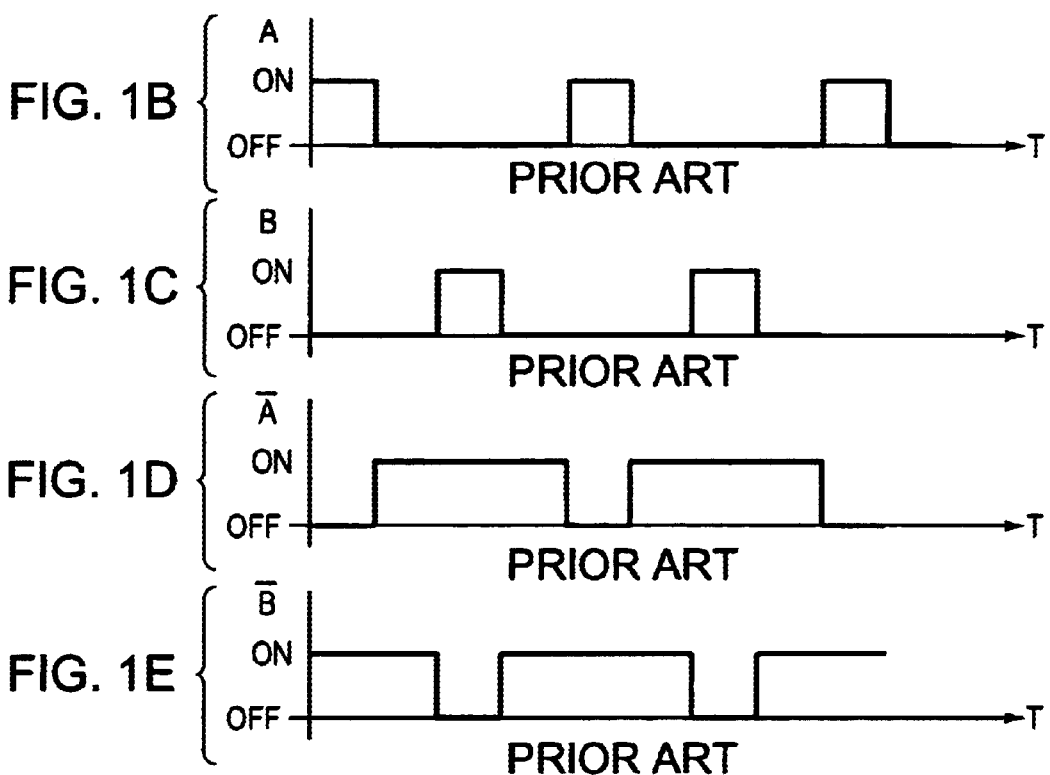

IN BOARD FILTER INDUCTOR FOR SWITCHING POWER SUPPLY ON A PRINTED CIRCUIT BOARD

BACKGROUND OF THE INVENTION

1. Field of the Invention

This invention relates to construction of an inductor, and more particularly to construction of an inductor built into a printed circuit board.

2. Background Information

An inductance is often used as a filter inductance in series with a power source and a load in order to provide a high impedance for high frequency ripple current components in the current flow to the load, and a filter capacitor provides a short circuit for the high frequency current components to ground. The design of an inductor for use on a small printed circuit (hereinafter PC) board is a problem. Various solutions suggested in the art include, simply soldering a wire wound inductor onto the PC board, the use of a substantially circular trace in the PC board to form a one turn inductor as shown herein in FIG. 7, etc.

Difficulties encountered by all solutions suggested in the art include the cost and geometry of soldering a wire wound inductor to the PC board, the narrowing and hence higher resistance of a semicircular trace on a PC board, etc.

There is needed an improved way to make a filter inductor for a power supply mounted on a small PC board.

The above and further advantages of the invention may be better understood by referring to the following description in conjunction with the accompanying drawings, in which like reference numbers indicate identical or functionally similar elements.

SUMMARY OF THE INVENTION

The invention is an inductor formed by two substantially straight traces on a multilayer PC board passing through a ferromagnetic "E" shaped core. The first trace is the positive output bus of the DC power supply, and the second trace is the negative output bus of the DC power supply. Sense lines used to sense voltage levels in the load are put through the same opening in the ferromagnetic "E" core as the negative output bus trace. The sense lines are traces in a level of the multilevel PC board.

BRIEF DESCRIPTION OF THE DRAWINGS

The invention description below refers to the accompanying drawings, of which:

FIG. 1A is a block schematic drawing of a switching power supply;

FIG. 1B–FIG. 1G are graphs showing signals within a switching power supply;

DETAILED DESCRIPTION OF AN ILLUSTRATIVE EMBODIMENT

Figure 1F:
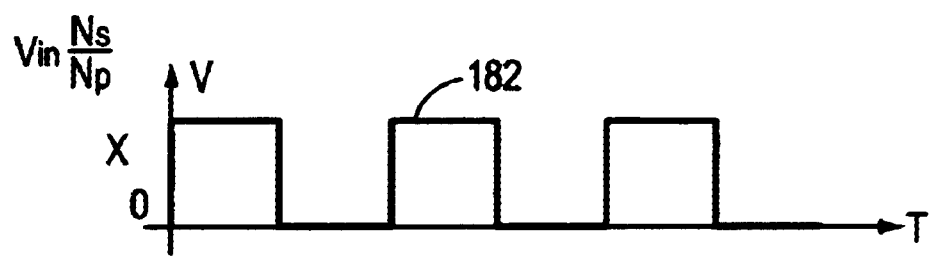

Turning now to FIG. 1A, operation of the switches in a synchronous switched DC to DC converter power supply 100 is shown. In an exemplary embodiment of the invention, a Field Effect Transistor (FET) is used for each switch. Thus the power supply is referred generically as a synch FET power supply. As will be evident to those skilled in the art, any type of convenient switch can be used, and the name "synch FET power supply" does not limit the invention to the use of FETs as switches.

Direct Current (DC) power source 102 supplies power at an input voltage $V_{in}$ on positive input bus 104 and negative input bus 105. In a first half cycle, transformer primary winding 106 is connected so that the "dotted" end 108 of the primary winding is first connected to the positive bus 104 through switch 110 and the un-dotted end 109 is connected to the negative input bus 105 through switch 112. Current then flows through the primary winding from the dotted end to the un-dotted end.

During a second half cycle, transformer primary winding 106 is connected so that the "dotted" end 108 of the primary winding is connected to the negative input bus 105 through switch 114 and the un-dotted end 109 is connected to the positive input bus 104 through switch 116. Current flow through the primary winding is then "in" at the un-dotted end and "out" through the dotted end.

Switches 110 and 112 are marked as the "A" switches because they close simultaneously. Further, switches 114 and 116 are marked as the "B" switches because they close simultaneously. FIG. 1B is a graph showing the "on" times of the A switches, 110 and 112. FIG. 1C is a graph showing the "on" times of the "B" switches 114 and 116.

Turning now to the secondary circuits, there are two secondary windings 120 and 122. The two secondary windings are joined at the positive output bus 124. Secondary 120 is connected at its dotted end to the negative output bus 126 by switch 128. Secondary 122 is connected at its un-dotted end to negative output bus 126 by switch 130.

Switch 128 is marked as "not A" because it is turned off when the A switches are on, and is turned on when the A switches are turned off. Switch 130 is marked as "not B" because it is turned off when the B switches are on, and is turned on when the B switches are turned off.

Turning now to FIG. 1D, there is a graph showing when "not A" switch 128 is turned on. Note that switch 128 is on when the A switches shown in FIG. 1B are off, and switch 128 is off when the A switches of FIG. 1B are on.

Turning now to FIG. 1E, there is a graph showing when "not B" switch 130 is turned on. Note that switch 130 is on when the B switches shown in FIG. 1C are off, and switch 130 is off when the B switches of FIG. 1C are on.

A DC output voltage 150 is produced between the positive output bus 124 and negative output bus 126, and is shown as $V_{out}$ 150. The output current is indicated as $I_{out}$. The output current $I_{out}$ delivered at the voltage $V_{out}$ between positive output bus 124 and negative output bus 126 delivers power to load 127. Load 127 is shown in dotted lines because the load is not part of power supply 100.

A filter capacitor C 140 is shown. Filter capacitor C 140 reduces the ripple voltage in the DC output delivered between positive output bus 124 and negative output bus 126.

Control circuits 160 supply the pulses shown in FIG. 1B, FIG. 1C, FIG. 1D, and FIG. 1E for turning the switches 110, 112, 114, 116, 128, 130 on and off.

The primary part 170 of the circuit includes the primary winding 106 of the transformer, the primary switches 110, 112, 114, 116, etc. The secondary part 172 of the circuit includes the secondary windings 120, 122 of the transformer, the secondary switches 128, 130, etc.

Filter inductor 180 reduces the ripple in the output DC voltage below that achieved by capacitor C 140 only.

FIG. 1F is a graph 182 giving the voltage observed at point X. Graph 182 shows the output voltage fluctuating between the value of "0" and the high value given by the ratio of the number of turns in the primary and the secondary windings, times the input voltage. That is, the voltage at point X 183 varies between zero and:

V(input)*(Number of secondary Turns)/(Number of Primary Turns)

Figure 1G:
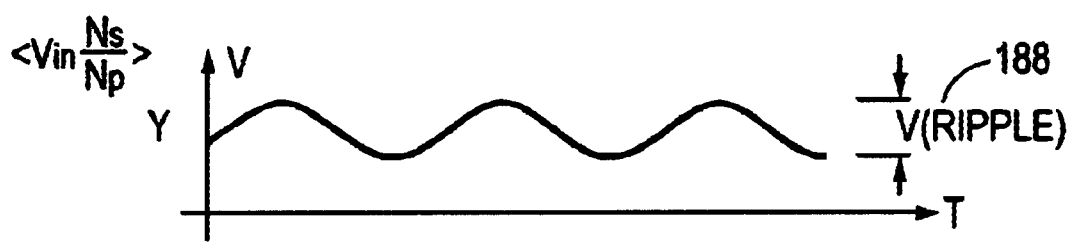

Turning now to FIG. 1G, a time average voltage observed at point Y 186, the output voltage, is shown. Rather than fluctuating between zero and another value, the voltage at point Y 186 has a steady DC component and a time varying component designated as ripple voltage 188. Introduction of filter inductor 180 reduces the ripple voltage to below that produced by a synch FET power supply 100, which does not have a filter inductor.

The output voltage 150 produced depends on a number of factors, including the input voltage $V_{in}$ between positive input bus 104 and negative input bus 105.

The output voltage is approximately given by the expression:

V(input)*(Number of secondary Turns)/(Number of Primary Turns)*(T(on)/T)

Here, T(on)/T is the duty cycle of the current flow through the primary winding 106 of the transformer. T(on) is the time that current flow is on while a set of primary switches is closed, and T is the length, in time, of a cycle.

Sense signal lines 190 are connected to load 127 to measure voltage in the load at desired locations (not shown in FIG. 1A). Sense signal lines 190 connect also to control circuits 160. Control circuits 160 adjust the output voltage $V_{out}$ 150 so that the voltages sensed by sense lines 190 meet pre-selected values. For example, sense line 192 is referred to as a "positive sense line", sense line 194 is referred to as a "negative sense line", and sense line 196 is referred to as a "trim sense line". In an exemplary method of operation of power supply 100, a person who designs the load 127 may connect positive sense line 192 to a connection in the load which is positive relative to ground, and may connect negative sense line 194 to a connection which is less positive relative to ground in the load 127. Trim line 196 is connected between the positive sense line 192 and negative sense line 194 by a resistor circuit to place trim line 194 at an electric potential intermediate between positive sense line 192 and negative sense line 194, and then control circuits 160 adjust the output voltage $V_{out}$ 150 to bring the trim sense line to a predetermined electric potential.

Figure 2:
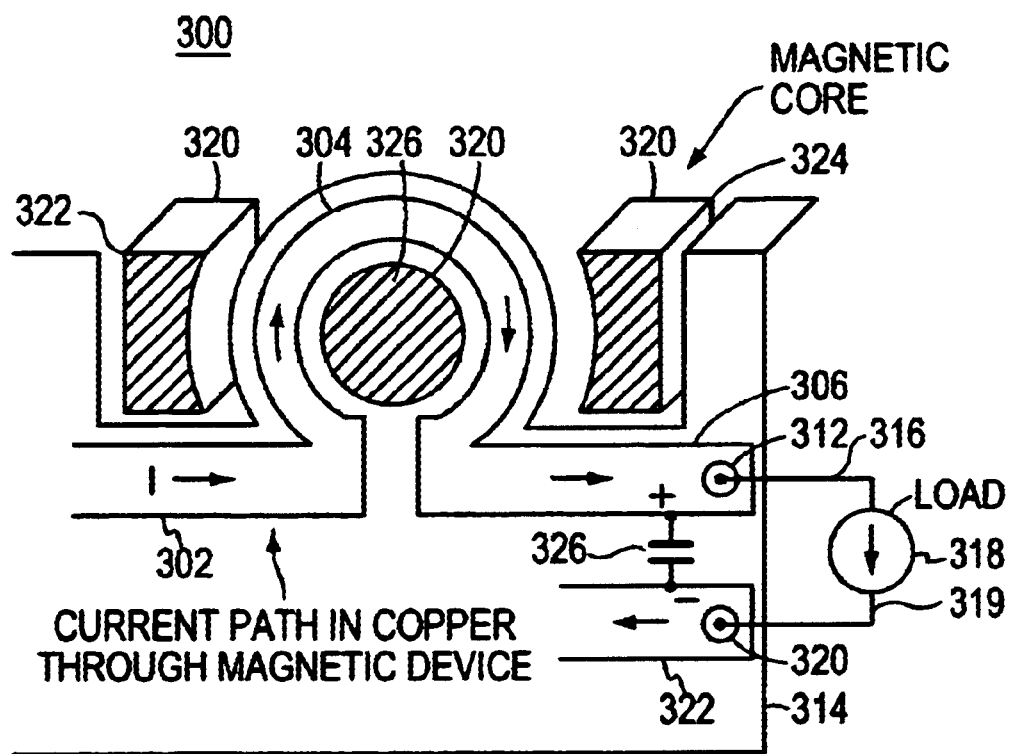
FIG. 2 is a view of a prior art use of a substantially circular trace to form an inductor on a PC board.

Turning now to FIG. 2, there is shown a prior art method 300 of constructing an inductor in a PC board. Trace 302 304 306 is a metallic electrical conducting trace in a layer of multilayer PC board 310. For example, trace 302 304 306 may be a copper trace formed by etching a copper cladding in a layer of multilayer PC board 310.

Trace 302 is a straight conducting path taking current toward a connector 312 at an edge 314 of PC board 310. Trace 302 narrows to a substantially circular path 304, and then widens again to a substantially straight path 306. Substantially circular path 304 is surrounded by a ferromagnetic core 320. Substantially circular path 304, in combination with ferromagnetic core 320 is a one turn inductor which serves as filter inductor 180 as shown in FIG. 1A. Ferromagnetic core 320 is, for example, shaped as an "E" shaped core with end arms 322 324, and a middle arm 326. Middle arm 326 has a circular cross section as shown in FIG. 2, and so middle arm 326 fits through a hole formed in PC board 310 so that substantially circular trace 304 surrounds middle arm 326. Ferromagnetic core 320 is attached so that the arms 322, 324, 326 are substantially perpendicular to the plane of PC board 310, and each arm passes through a hole in PC board 310.

Trace 306, for example delivers positive DC voltage to connector 312. Line 316 connects to connector 312, and line 316 carries electric power to load 318. Line 319 is the power return line and connects at connector 320 to negative return trace 322.

Filter capacitor 326 connects between positive trace 306 and negative trace 322. Filter capacitor 326 serves the function of filter capacitor 140 shown in FIG. 1A.

Figure 3:
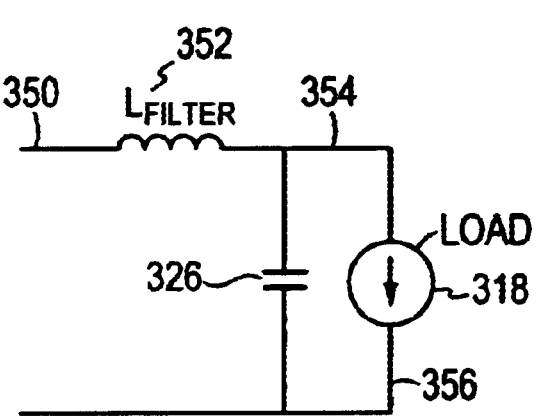
FIG. 3 is an electrical schematic diagram of the arrangement of FIG. 2.

Turning now to FIG. 3, there is shown an electrical schematic diagram of the arrangement of FIG. 2, including the one turn inductor formed by trace 304 and ferromagnetic core 320. Line 350 represents trace 302. Filter inductor 352 represents substantially circular trace 304 coupled with ferromagnetic core 320. Line 354 represents trace 306 and line 316 carrying power to load 318. Line 356 represents power return line 319 and negative return trace 322. Capacitor 326 connects between positive power supply line 354 and negative return power line 356.

Figure 4A:
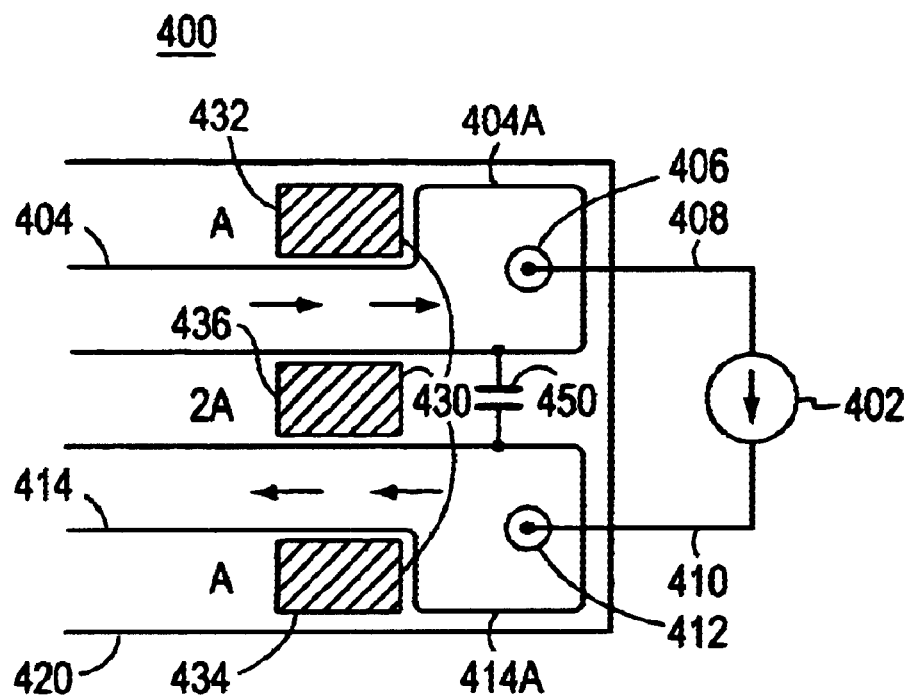
FIG. 4A is a view of traces and a ferromagnetic core in a PC board in accordance with the invention.

Turning now to FIG. 4A, the inventive inductor is shown as an assembly 400 on a multilayer PC board 420.

In operation, power is supplied to a load 402 through trace 404 to connector 406, and then through line 408. For example, trace 404 is the positive output bus of a DC power supply. The power return line is from load 402 through line 410 to connector 412, and through trace 414. For example, trace 414 is the negative output bus of the DC power supply.

Trace 404 and trace 414 are metallic conducting traces formed in a layer of multilayer PC board 420. For example, trace 404 and trace 414 may be copper traces formed by etching a copper cladding in a layer of multilayer PC board 420.

Trace 404 and trace 414 both pass through the openings of an "E" shaped ferromagnetic core 430 having end arm 432 and end arm 434. Center arm 436 of the ferromagnetic core 430 passes between traces 404 414. Arms 432 434 436 of "E" core 430 pass through holes formed in PC board 420. In an exemplary embodiment of the invention, the cross sectional area of center arm 436 of "E" core 430 is twice the area of the two end arms 432 434 in order to optimize the magnetic path through the ferromagnetic core 430.

Trace 404 passing through an opening between arms 432 and 436 of ferromagnetic core 430 forms a first inductor. Trace 414 passing through an opening between arms 434 and 436 of ferromagnetic core 430 forms a second inductor. The first inductor and the second inductor then provide a filter inductor system for reducing ripple voltage in the output of the power supply.

Filter capacitor 450 is connected between trace 404 and trace 414. Capacitor 450 [404] also reduces ripple voltage in the output voltage of the power supply be providing a short circuit for high frequency variations in the output voltage.

Figure 4B:
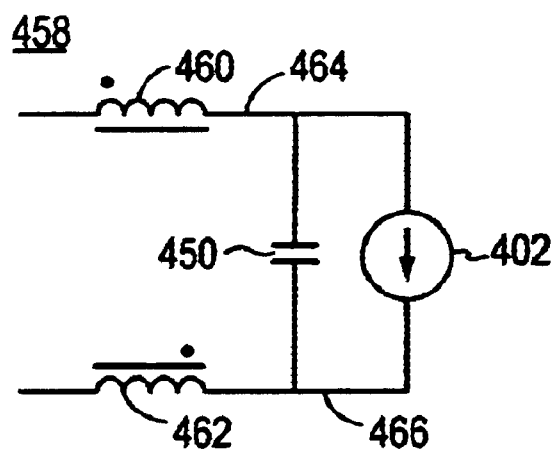
FIG. 4B is an electrical schematic diagram of the arrangement of FIG. 4A.

Turning now to FIG. 4B, there is shown an electrical schematic diagram 458 of circuit 400 of FIG. 4A. Inductor 460 represents the inductor formed by trace 404 passing through the opening in ferromagnetic core 430 between end arm 432 and center arm 436. Inductor 462 represents the inductor formed by trace 414 passing through the opening in ferromagnetic core 430 between end arm 434 and center arm 436. Line 464 represents trace 404 portion 404A, connector 406 and line 408. Line 466 represents line 410, connector 412, and trace 414 portion 414A. Filter capacitor 450 connects between line 464 and line 466.

Figure 5:
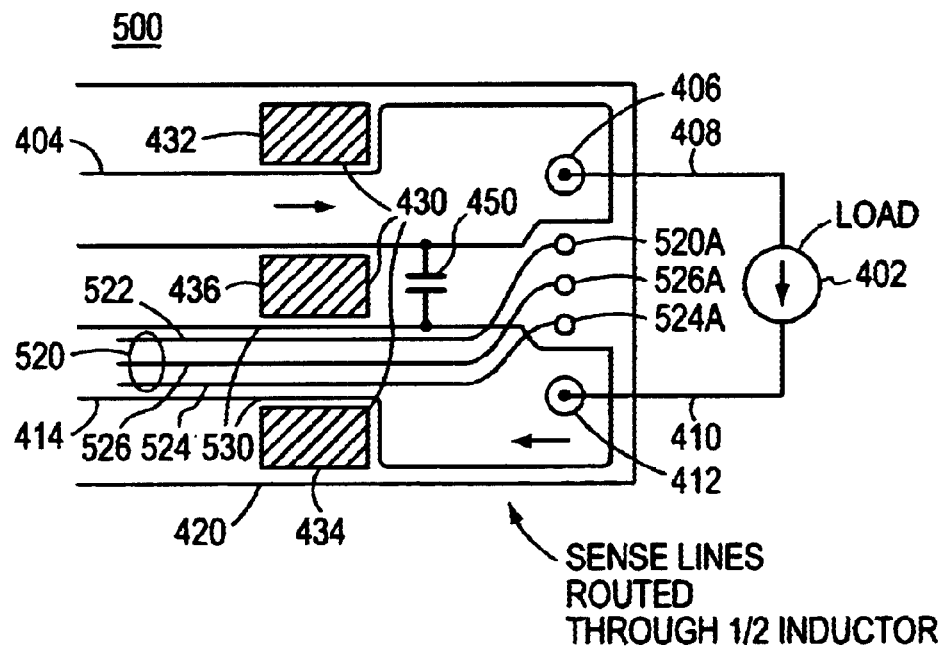
FIG. 5 is a view of traces and a ferromagnetic core in a PC board in accordance with the invention.

Turning now to FIG. 5, there is shown inventive inductor assembly 500 having the addition of voltage sense lines 520. In an exemplary embodiment of the invention, there are three sense lines, sense line 522, sense line 524, and sense line 526. In a further exemplary embodiment of the invention sense, lines 520 represent sense lines 190 shown in FIG. 1. For example sense line 522 may be the positive sense line, as is sense line 192. Sense line 524 may be the negative sense line, as is sense line 194. Sense line 526 may be the trim sense line, as is sense line 196.

In an exemplary embodiment of the invention, sense lines 520 are routed through an opening in ferromagnetic core 430, for example through the opening 530 between end arm 434 and center arm 436, the same opening through which is routed the negative output bus trace 414. For example, positive sense line 522 is routed from connector 522A through the opening 530 in ferromagnetic core 430. Further, negative sense line 524 is routed from connector 524A through opening 530 in ferromagnetic core 430. And still further, trim sense line 526 is routed from connector 526A through opening 530 in ferromagnetic core 430. Connectors 522A, 524A, 526A provide a means for making an external connection to load 402, for example load 127.

In an exemplary embodiment of the invention, sense lines 522, 524, 526 may each be traces in a multilayer PC board which are at a different level in the multilayer PC board from the level carrying negative output bus trace 414. In any event, in an exemplary embodiment of the invention, sense lines 522, 524, 526 pass through the same opening in ferromagnetic core as does negative output bus trace 414.

Figure 6:
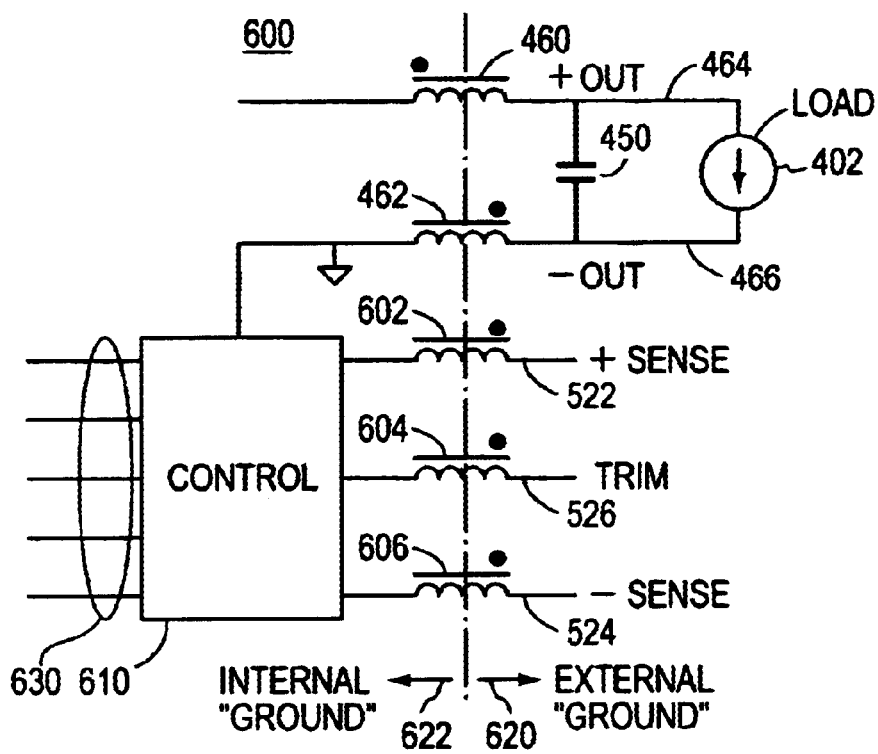
FIG. 6 is an electrical schematic diagram of the arrangement of FIG. 5.

Turning now to FIG. 6, an electrical schematic diagram 600 of the assembly 500 is shown. Inductor 460 represents the geometry of conducting trace 404 passing through the opening in ferromagnetic core 430 between side arm 432 and center arm 436. Inductor 462 represents the geometry of conducting trace 414 passing through the opening in ferromagnetic core 430 between side arm 434 and center arm 436. Inductor 460 and inductor 462 present a high impedance to high frequency current variations in the current flowing from the positive output bus of trace 404 through the load 402 and returning through the negative output bus of trace 414. Filter capacitor 450 acts as a short circuit to the high frequency components of the current, and so tends to short them out. Together, the high impedance offered to the high frequency ripple current components of the current flow to the load by the inductances 460 462, and the short circuit offered by filter capacitor 450 to the high frequency current components, serve as a good power supply filter.

Inductor 602, inductor 604, and inductor 606 are formed from the passage of the sense lines 522, 524, 526 through the opening in ferromagnetic core 430 between the side arm 434 and the center arm 436. That is, the sense lines all pass through the same opening, and in the same direction, as does the negative power bus trace 414. In an exemplary embodiment of the invention, the traces in multilayer PC board 420 forming the sense lines 522, 524, 526 are all the same size, and accordingly the inductors that these sense lines form with ferromagnetic core 430 all have the same inductance.

The polarity of the inductors 460, 462, 602, 604, 606 is marked by a dot in standard electrical engineering notation. Current flow in the positive output bus trace 404 as shown by line 464 is from the dotted end toward the undotted end of the inductor. In contrast, current flow in the negative output bus trace 414 as shown by line 466 is from the undotted end to the dotted end. Further, the sense lines, 522, 524, 526 each have voltage levels sensed in the load causing current flows through their respective inductors 602, 604, 606 from the undotted end toward the dotted end of their respective inductors.

Voltages are induced in the sense lines 522 524 526 by transformer action of the coupling of inductances 602 604 606 with inductor 462, since the conductors forming each of these inductors pass through the same opening in ferromagnetic core 430 formed by end arm 434 and center arm 436. Further, electric current flows are in the direction of the undotted end to the dotted end of the inductors. Accordingly, the voltages induced in the sense lines are all in the same polarity.

The sense voltages are measured at the load 402 relative to an external ground 620. External ground 620 is connected to the internal ground 622 of PC board 420. The sense voltages at control circuits 610 are measured relative to the internal ground 622 of PC board 420. Accordingly, the voltages induced in the sense lines 522 524 526 by transformer action from current flow in negative output bus trace 414, through the mutual inductance provided by opening in the ferromagnetic core 430 between side arm 434 and center arm 436, mutually cancel out in the control circuits 610.

Signal lines 630 couple to the various switches of the power supply, as shown in FIG. 1.

Figure 7:
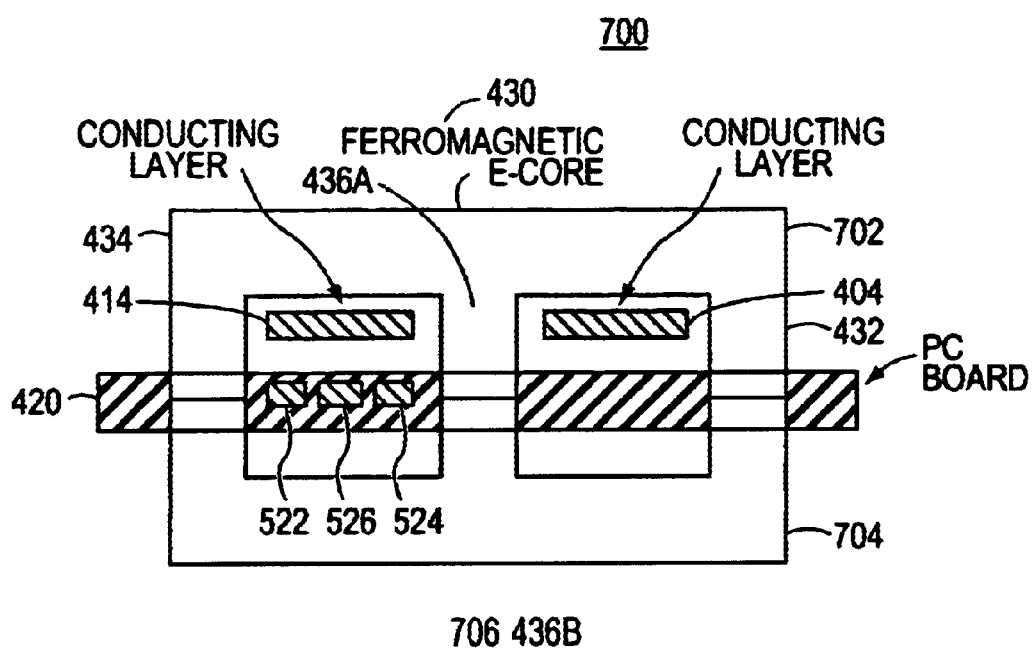
FIG. 7 is a cross section end view of a PC board and a ferromagnetic core in accordance with the invention.

Turning now to FIG. 7, an end view 700 of multilayer PC board 420 is shown. Ferromagnetic core 430 is shown made of two pieces, piece 702 and piece 704. Center arm 436 is shown as two parts, center arm 436A of ferromagnetic core piece 702, and center arm 436B of ferromagnetic core piece 704. Ferromagnetic core piece 702 and piece 704 are but joined by, for example glue, or for example, epoxy adhesive, etc. at the glue lines 710, 712.

Conducting layer 404 is the positive output bus trace on PC board 420. Conducting trace 414 is the negative output bus trace on PC board 420. Sense line conducting traces 522 524 526 are shown passing through the same opening between end arm 434 and center arm 436A 436B of ferromagnetic core 430 as does negative output bus trace 414.

Both trace 404 and trace 414 are made into layers of PC board 420, however for the sake of clarity are shown in a generalized way in FIG. 7.

Air gap 706 between the end of center arm 436A and center arm 436B is used to set the inductance of inductances 460, 462 to a desired value.

It is to be understood that the above described embodiments are simply illustrative of the principles of the invention. Various other modifications and changes may be made by those skilled in the art which embody the principles of the invention and fall within the spirit and scope thereof.

What is claimed is:

1. An inductor built into a printed circuit board (hereinafter PC board), comprising:
   a first electrically conducting trace of said PC board serving as a positive output bus of a power supply built on said PC board;
   a second electrically conducting trace serving as a negative output bus of said power supply;
   a ferromagnetic core placed around said first trace and said second trace to form a first inductor by said first trace passing through a first opening in said ferromagnetic core, and to form a second inductor by passage of said second trace through a second opening in said ferromagnetic core; and at least one sense line to measure a voltage level in a load to which electrical power is delivered by said positive output bus and said negative output bus, and said at least one sense line passes through a said opening in said ferromagnetic core.

2. The apparatus as in claim 1, further comprising:

said ferromagnetic core having an "E" configuration with a first end arm, a center arm, and a second end arm, said first opening between said first end arm and said center arm, and said second opening between said second end arm and said center arm.

3. The apparatus as in claim 1, further comprising:

a filter capacitor connected between said first trace and said second trace to provide a low impedance path for high frequency components of the current delivered on said first trace and said second trace.

4. The apparatus as in claim 1, further comprising:

said at least one sense line includes a plus sense signal line.

5. The apparatus as in claim 1, further comprising:

said at least one sense line includes a negative sense signal line.

6. The apparatus as in claim 1, further comprising:

said at least one sense line includes a trim signal line.

7. The apparatus as in claim 1, further comprising:

said at least one sense line includes a positive sense signal line, a negative sense signal line, and a trim sense signal line.

8. The apparatus as in claim 1, further comprising:

said at least one sense line passes through said second opening.

9. An inductor built into a printed circuit board (hereinafter PC board), comprising:

a first electrically conducting trace of said PC board serving as a positive output bus of a power supply built on said PC board;

a second electrically conducting trace serving as a negative output bus of said power supply;

a ferromagnetic core placed around said first trace and said second trace to form a first inductor by said first trace passing through a first opening in said ferromagnetic core, and to form a second inductor by passage of said second trace through a second opening in said ferromagnetic core;

a plurality of sense lines to measure voltage levels in a load to which electrical power is delivered by said positive output bus and said negative output bus, and said plurality of sense lines pass through the said first opening in said ferromagnetic core.

10. The inductor of claim 9, further comprising:

said plurality of sense lines includes one sense line to measure negative potential at a load energized by said power supply.

11. The inductor of claim 9, further comprising:

said plurality of sense lines includes one sense line to measure positive potential at a load energized by said power supply.

12. The inductor of claim 9, further comprising:

said plurality of sense lines includes one sense line to measure potential between a positive connection and a negative connection at a load energized by said power supply.

13. The inductor of claim 9, further comprising:

said plurality of sense lines includes a first sense line to measure a negative potential, a second sense line to measure a positive potential, and a third sense line to measure a potential intermediate between said negative potential and said positive potential, all at a load energized by said power supply.

14. An inductor on a PC board, comprising:

a positive first trace in said PC board;

a negative second trace in said PC board;

said first trace passing through a first opening in a ferromagnetic core;

said second trace passing through a second opening in said ferromagnetic core;

means for arranging an electric current to flow from said first trace, through said first opening in said ferromagnetic core, and back along said second trace through said second opening in said ferromagnetic core, to thereby place inductance made by passage of said first trace and said second trace through said ferromagnetic core in said electric current flow; and means for passing a plurality of sense lines through a said opening in said ferromagnetic core, said plurality of sense lines to measure a voltage level in a load to which electrical power is delivered by said positive output bus and said negative output bus.

15. The inductor of claim 14, further comprising:

means for including one sense line of said plurality of sense lines to measure negative potential at a load energized by said power supply.

16. The inductor of claim 14, further comprising:

means for including one sense line of said plurality of sense lines to measure positive potential at a load energized by said power supply.

17. The inductor of claim 14, further comprising:

means for including one sense line of said plurality of sense lines to measure potential between a positive connection and a negative connection at a load energized by said power supply.

18. The inductor of claim 14, further comprising:

means for including in said plurality of sense lines a first sense line to measure a negative potential, a second sense line to measure a positive potential, and a third sense line to measure a potential intermediate between said negative potential and said positive potential, all at a load energized by said power supply.

19. A method for making an inductor on a PC board, comprising:

making a positive power output bus as a first trace in said PC board;

making a negative power output bus as a second trace in said PC board;

passing said first trace through a first opening in a ferromagnetic core;

passing said second trace through a second opening in said ferromagnetic core; and passing least one sense line through a said opening in said ferromagnetic core, said at least one sense line to measure a voltage level in a load to which electrical power is delivered by said positive output bus and said negative output bus.

20. An inductor built into a printed circuit board, comprising:

a first electrically conducting trace of said PC board serving as a positive conductor;

a second electrically conducting trace serving as a negative conductor; a ferromagnetic core placed around said first trace and said second trace to increase the inductance of both a first inductor formed by said first trace passing through a first opening in said ferromagnetic core, and a second inductor formed by passage of said second trace through a second opening in said ferromagnetic core; and at least one sense line to measure a voltage level in a load to which electrical power is delivered by said positive output bus and said negative output bus, and said at least one sense line passes through a said opening in said ferromagnetic core.

21. A method for making an inductor on a PC board, comprising:

making a positive first trace in said PC board;

making a negative second trace in said PC board;

passing said first trace through a first opening in a ferromagnetic core;

passing said second trace through a second opening in said ferromagnetic core; arranging an electric current to flow from said first trace, through said first opening in said ferromagnetic core, and back along said second trace through said second opening in said ferromagnetic core, to thereby place inductance made by passage of said first trace and said second trace through said ferromagnetic core in said electric current flow; and passing least one sense line through a said opening in said ferromagnetic core, said at least one sense line to measure a voltage level in a load to which electrical power is delivered by said positive output bus and said negative output bus.

22. A method for making an inductor on a PC board, comprising:

making a positive first trace in said PC board;

making a negative second trace in said PC board;

passing said first trace through a first opening in a ferromagnetic core;

passing said second trace through a second opening in said ferromagnetic core; arranging an electric current to flow from said first trace, through said first opening in said ferromagnetic core, and back along said second trace through said second opening in said ferromagnetic core, to thereby place inductance made by passage of said first trace and said second trace through said ferromagnetic core in said electric current flow; and passing a plurality of sense lines through a said opening in said ferromagnetic core, said plurality of sense lines to measure a voltage level in a load to which electrical power is delivered by said positive output bus and said negative output bus.

23. The method of claim 22, further comprising:

including one sense line of said plurality of sense lines to measure negative potential at a load energized by said power supply.

24. The method of claim 22, further comprising:

including one sense line of said plurality of sense lines to measure positive potential at a load energized by said power supply.

25. The method of claim 22, further comprising:

including one sense line of said plurality of sense lines to measure potential between a positive connection and a negative connection at a load energized by said power supply.

26. The method of claim 22, further comprising:

including in said plurality of sense lines a first sense line to measure a negative potential, a second sense line to measure a positive potential, and a third sense line to measure a potential intermediate between said negative potential and said positive potential, all at a load energized by said power supply.

* * * * *